US009543688B2

(12) United States Patent
Pao et al.

(10) Patent No.: US 9,543,688 B2
(45) Date of Patent: Jan. 10, 2017

(54) ELECTRICAL CONNECTOR HAVING TERMINALS EMBEDDED IN A PACKAGING BODY

(71) Applicant: CHIEF LAND ELECTRONIC CO., LTD., New Taipei (TW)

(72) Inventors: Chung-Nan Pao, New Taipei (TW); Chin-Hsiang Chou, Taipei County (TW); Po-Shen Chen, Taipei County (TW); Yu-Hsiung Lin, New Taipei (TW); Hsiao-Chung Chen, New Taipei (TW)

(73) Assignee: CHIEF LAND ELECTRONIC CO., LTD., New Taipei (TW)

( * ) Notice: Subject to any disclaimer, the term of this patent is extended or adjusted under 35 U.S.C. 154(b) by 0 days.

(21) Appl. No.: 14/727,694

(22) Filed: Jun. 1, 2015

(65) Prior Publication Data

US 2016/0352040 A1 Dec. 1, 2016

(51) Int. Cl.

*H01R 12/00* (2006.01)
*H05K 1/00* (2006.01)
*H01R 13/514* (2006.01)
*H01R 4/02* (2006.01)

(52) U.S. Cl.

CPC .............. *H01R 13/514* (2013.01); *H01R 4/02* (2013.01)

(58) Field of Classification Search

CPC .............. H01R 12/724; H01R 13/6594; H01R 13/6587
USPC ........... 439/79, 701, 607.07, 607.09, 607.11, 439/607.23
See application file for complete search history.

(56) References Cited

U.S. PATENT DOCUMENTS 6,551,140 B2 * 4/2003 Billman ............... H01R 13/514 439/607.07
7,387,535 B2 * 6/2008 Minich ................ H01R 13/501 439/496
8,764,483 B2 * 7/2014 Ellison ................. H01R 12/724 439/607.07
9,130,314 B2 * 9/2015 Pao .................... H01R 13/6587
9,214,768 B2 * 12/2015 Pao .................... H01R 13/6587
2007/0207641 A1 * 9/2007 Minich ................ H01R 23/688 439/79
2014/0273651 A1 * 9/2014 Pao .................... H01R 13/6461 439/660
2015/0079821 A1 * 3/2015 Pao .................... H01R 13/6587 439/108

* cited by examiner

*Primary Examiner* — Hae Moon Hyeon
(74) *Attorney, Agent, or Firm* — Li & Cai Intellectual Property (USA) Office

(57) ABSTRACT

An electrical connector includes a housing and a plurality of terminal wafers. The housing is formed with a plurality of terminal slots along a traverse direction. The terminal wafers are contiguous to each other and retained in the housing. Each terminal wafer has a first terminal, a second terminal and a packaging body. The first terminal has a first contacting section, a first soldering portion and a first embedded section. The second terminal has a second contacting section, a second soldering portion and a second embedded section. The first and second contacting sections are extended along a plugging direction into one corresponding terminal slot. The packaging body wraps the first and second embedded sections. A curve contour of the first embedded section is corresponded to a curve contour of the second embedded section, so that an attachment relationship is configured with substantial identical distance therebetween.

20 Claims, 10 Drawing Sheets

20

ELECTRICAL CONNECTOR HAVING TERMINALS EMBEDDED IN A PACKAGING BODY

BACKGROUND OF THE INVENTION

1. Field of the Invention

The instant disclosure relates to an electrical connector, in particular, to an electrical connector having a plurality of terminals formed in pairs and assembled side by side in an insulating housing for clamping and electrically connecting terminals of an electrical plug connector.

2. Description of Related Art

Electrical connectors have been widely used to transmit electricity or signals between two devices. There is one kind of electrical connector having a plurality of terminals formed in pairs and assembled side by side in an insulating housing for clamping and electrically connecting terminals of an electrical plug connector, such as Peripheral Component Interconnect Express (PCIe) connector.

Such kind of assembly process usually needs to insert the terminals one by one in the terminal grooves of the insulating housing. The terminals usually are formed with many interference portions in a hook shape, so as to retain the terminals in the insulating housing by interference force. However, the terminal is easily deformed because of resistance force during the assembly process, thus the reliability of the electronic connector is degraded. Further, the assembly speed is slow and the terminals may be damaged. Moreover, some terminals may be made of precious metal for strengthening the rigidity to avoid deforming during the assembly process, and this way adds cost.

As the electronic transmission technology is advancing, the frequency of the electrical connector's signals transmission has become higher and higher. How to solve the above-mentioned problems and avoid the problem of electromagnetic interference to enhance the complete performance of signal transmission, these are still the problems waiting to be solved.

BRIEF SUMMARY OF THE INVENTION

The instant disclosure provides an electrical connector, having terminals embedded in a packaging body to form a terminal wafer, and the terminal wafer is assembled in a housing, so as to provide a steady structure with high reliability, to prevent terminals from being deformed and accelerate the assembling speed.

To achieve the above objects, according to one exemplary embodiment of the instant disclosure, an electrical connector is provided, which includes a housing and a plurality of terminal wafers. The terminal wafers are contiguous to each other and retained in the housing in a plugging direction. Each terminal wafer has a first terminal, a second terminal, and a packaging body. The first terminal has a first contacting section, a first soldering portion, and a first embedded section connecting the first contacting section to the first soldering portion. The second terminal has a second contacting section, a second soldering portion, and a second embedded section connecting the second contacting section to the second soldering portion. The first contacting sections of the first terminals and the second contacting sections of the second terminals are extended along the plugging direction in pairs. The packaging body wraps the first embedded section of the first terminal and the second embedded section of the second terminal. A curve contour of the first embedded section corresponds to a curve contour of the second embedded section, so that an attachment relationship is configured with substantial identical distance therebetween.

Thus, the present disclosure has advantages as follows. The present disclosure provides a steady structure with a high reliability, and does not affect the transmitting performance at high frequency. The corresponding curve contour is a benefit to lower the electromagnetic interference between the first terminals and the second terminals, to enhance the efficiency of signal transmitting.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

Figure 1:
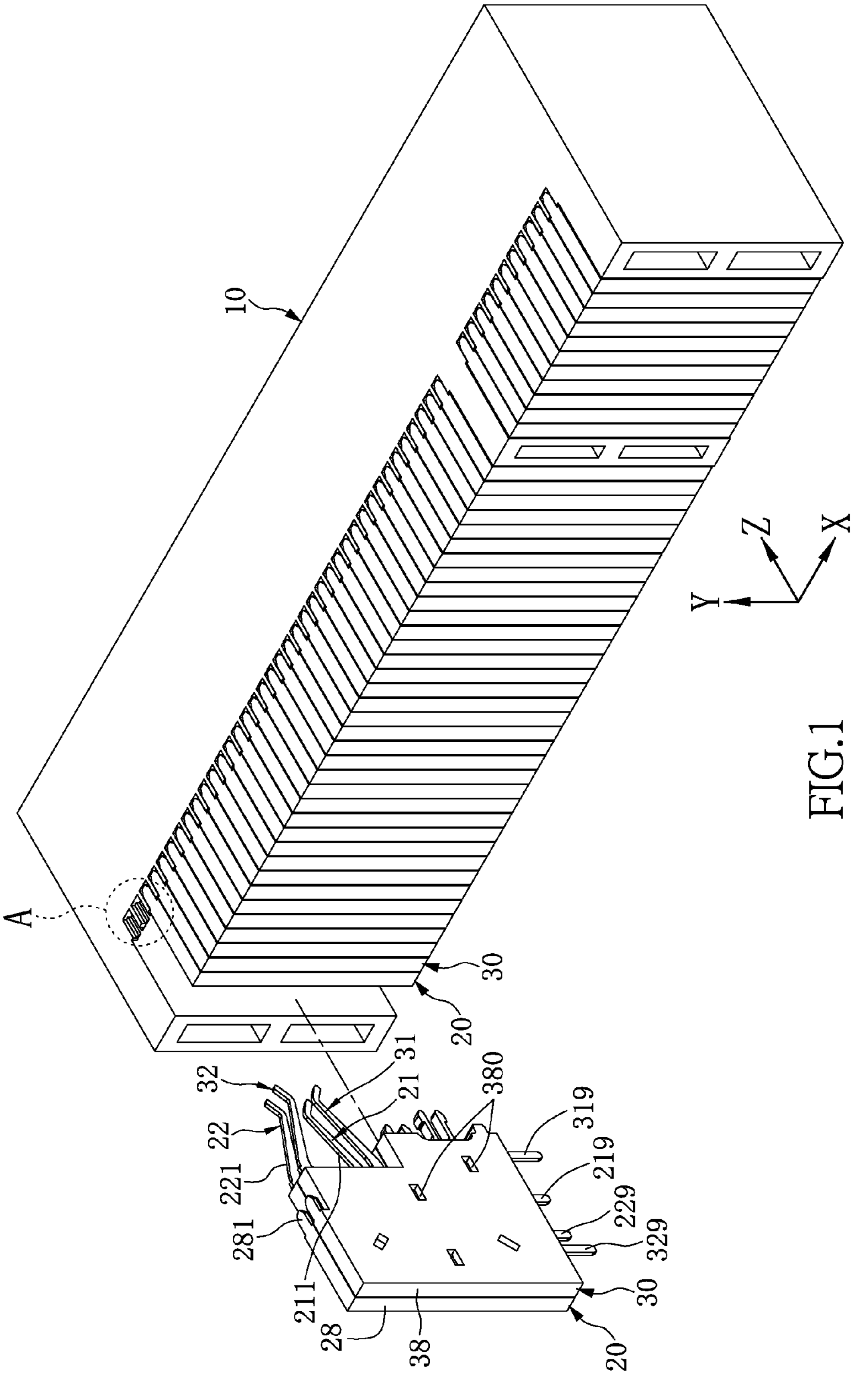
FIG. 1 is a perspective view of an electrical connector of the instant disclosure.
Figure 2:
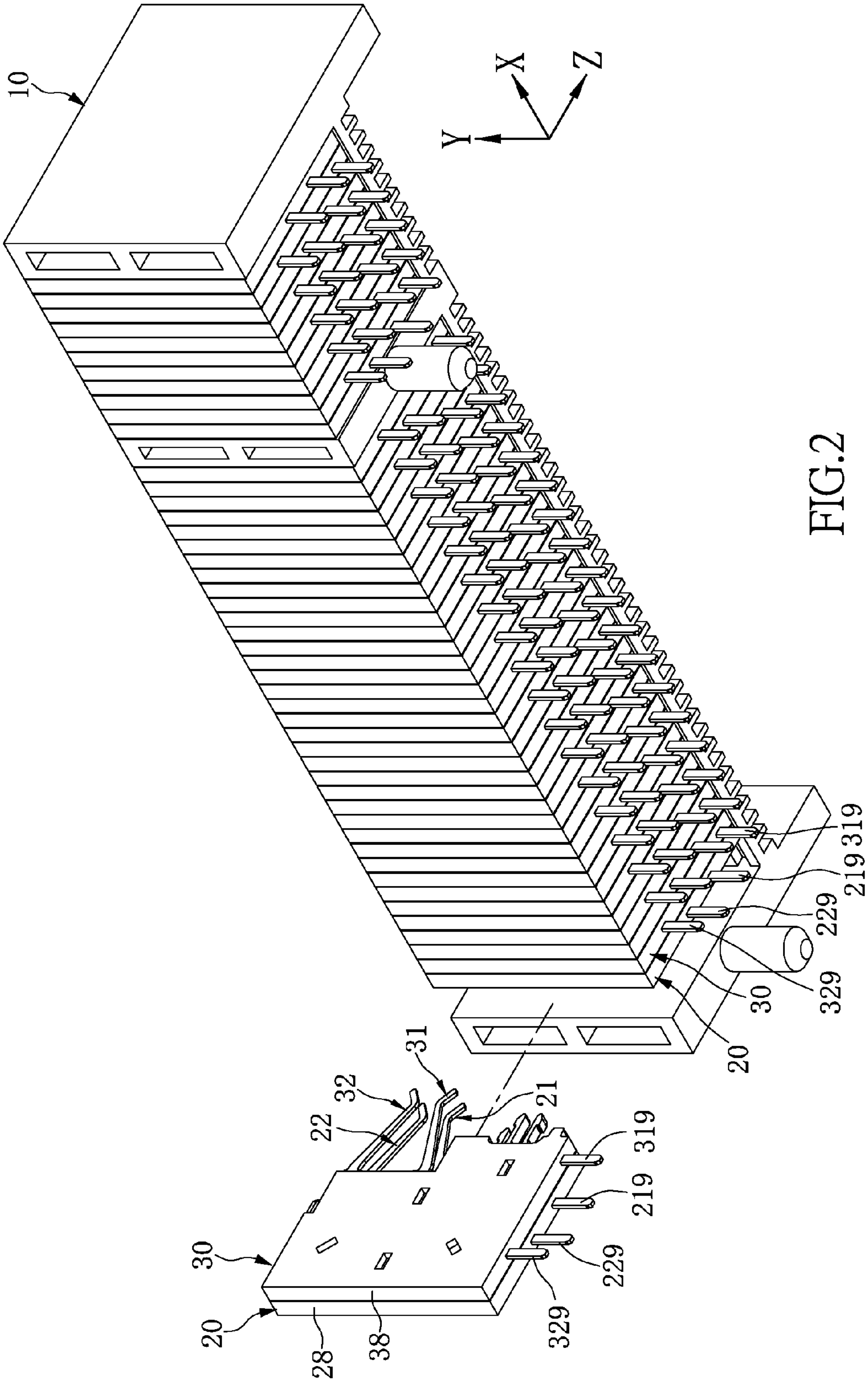
FIG. 2 is another perspective view of electrical connector according to the instant disclosure.
Figure 3:
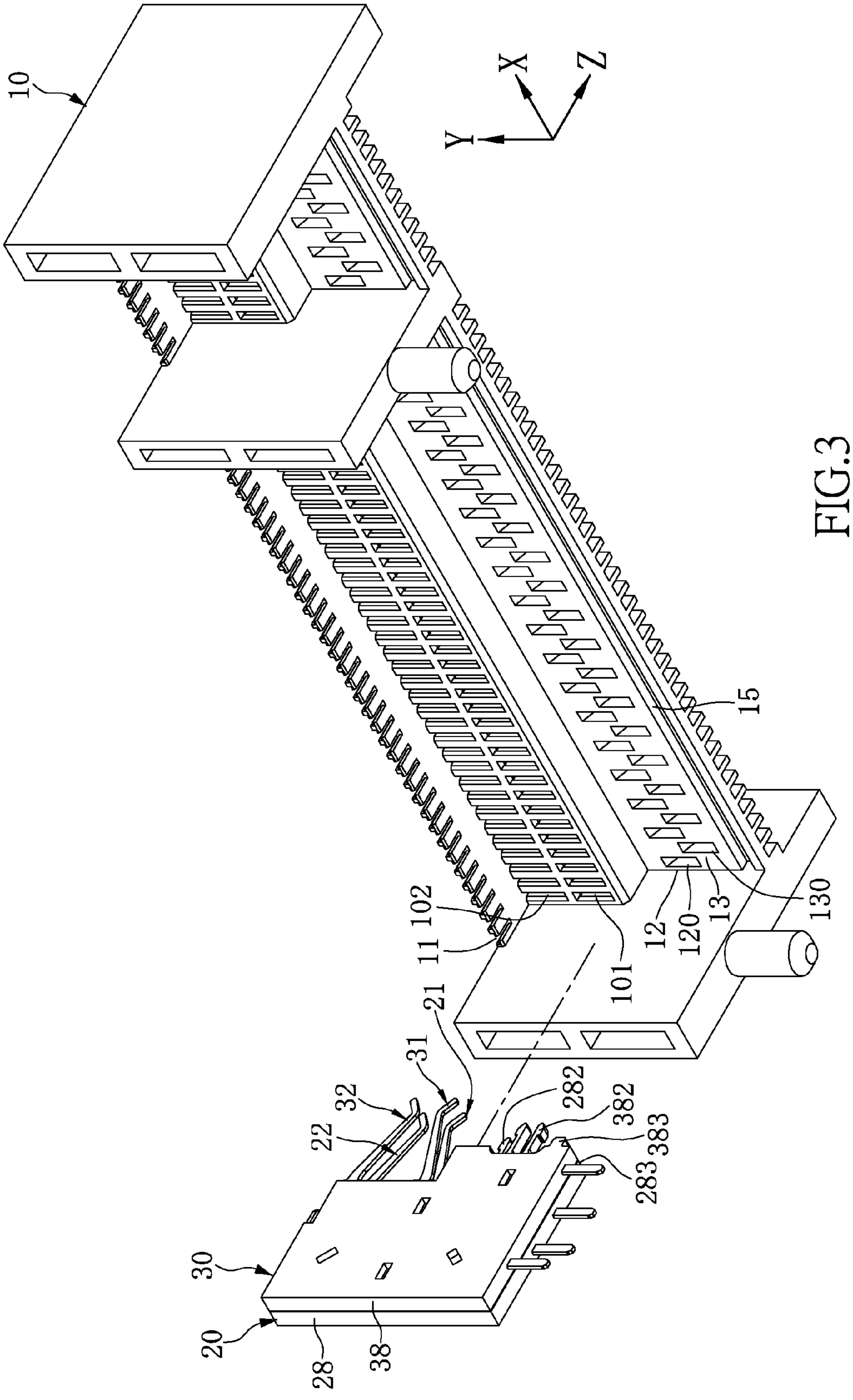
FIG. 3 is a perspective view of a housing and a terminal-wafer set according to the instant disclosure.

Please refer to FIG. 1 to FIG. 3. FIG. 1 and FIG. 2 are different perspective views of the electrical connector of the present disclosure; and FIG. 3 is a perspective view of a terminal-wafer set separated from a housing according to the present disclosure. The present disclosure provides an electrical connector, which includes a housing 10, and a plurality of terminal wafers 20, 30. The housing 10 is made of insulating material. Each two neighboring terminal wafers 20, 30 is configured as a terminal wafer assembly.

As shown in FIG. 3, the housing 10 is formed with a plurality of terminal slots 101, 102 in a traverse direction thereof, that is, in the X-axis direction of the figures. The terminal slots 101, 102 are arranged in an upper row and a lower row parallel to each other in the traverse direction.

As shown in FIG. 1 and FIG. 2, the terminal wafers 20, 30 are adjacent to each other in the traverse direction, and retained in the housing 10 along a plugging direction, which is the Z-axis in the figures. Each of the terminal wafers 20 (30) has a first terminal 21 (31), a second terminal 22 (32), and a packaging body 28 (38). One characteristic of the present disclosure is that, the packaging body 28 (38) partially wrapped around the first terminal 21 (31) and the second terminal 22 (32) by insert molding technology. The insert molding technology means a technology of plastic injection, which uses a mold to fix the terminals in the mold cavity before injecting plastic into the mold cavity, and then the plastic material is injected into the mold cavity. The first terminal 21 (31) and the second terminal 22 (32) respectively have one end exposed outside the packaging body 28 (38) in a pair (as a right side of the packaging body 28 shown in FIG. 1), which are extended into the corresponding terminal slot 101 (102) in the plugging direction (the direction of Z-axis) away from the packaging body 28 (38) and closed towards each other for providing a clamping function. The first terminal 21 (31) and the second terminal 22 (32) respectively have another end exposed outside another side of the packaging body 28 (38) (as a bottom edge of the packaging body 28 shown in FIG. 2). Comparing with the conventional technology of assembling terminals one by one in the housing, the terminals of the present disclosure will not be deformed easily during the assembling process, and the assembling speed can be accelerated. The present disclosure provides an electrical connector with a steady structure of high reliability.

Figure 1A:
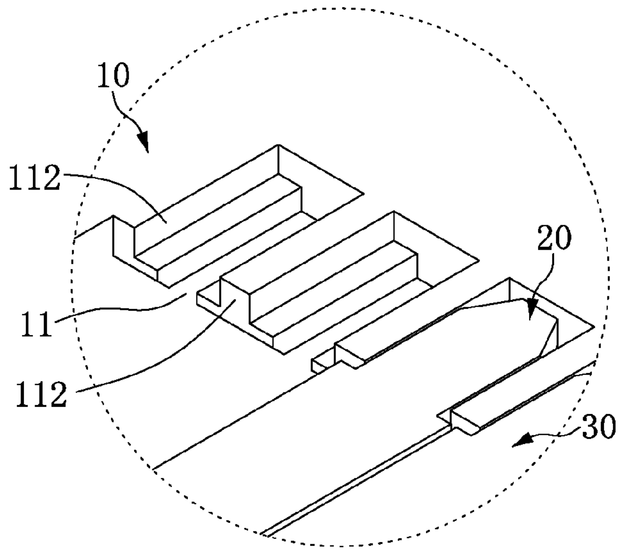
FIG. 1A is an enlarged view of "A" part in FIG. 1.
Figure 4:
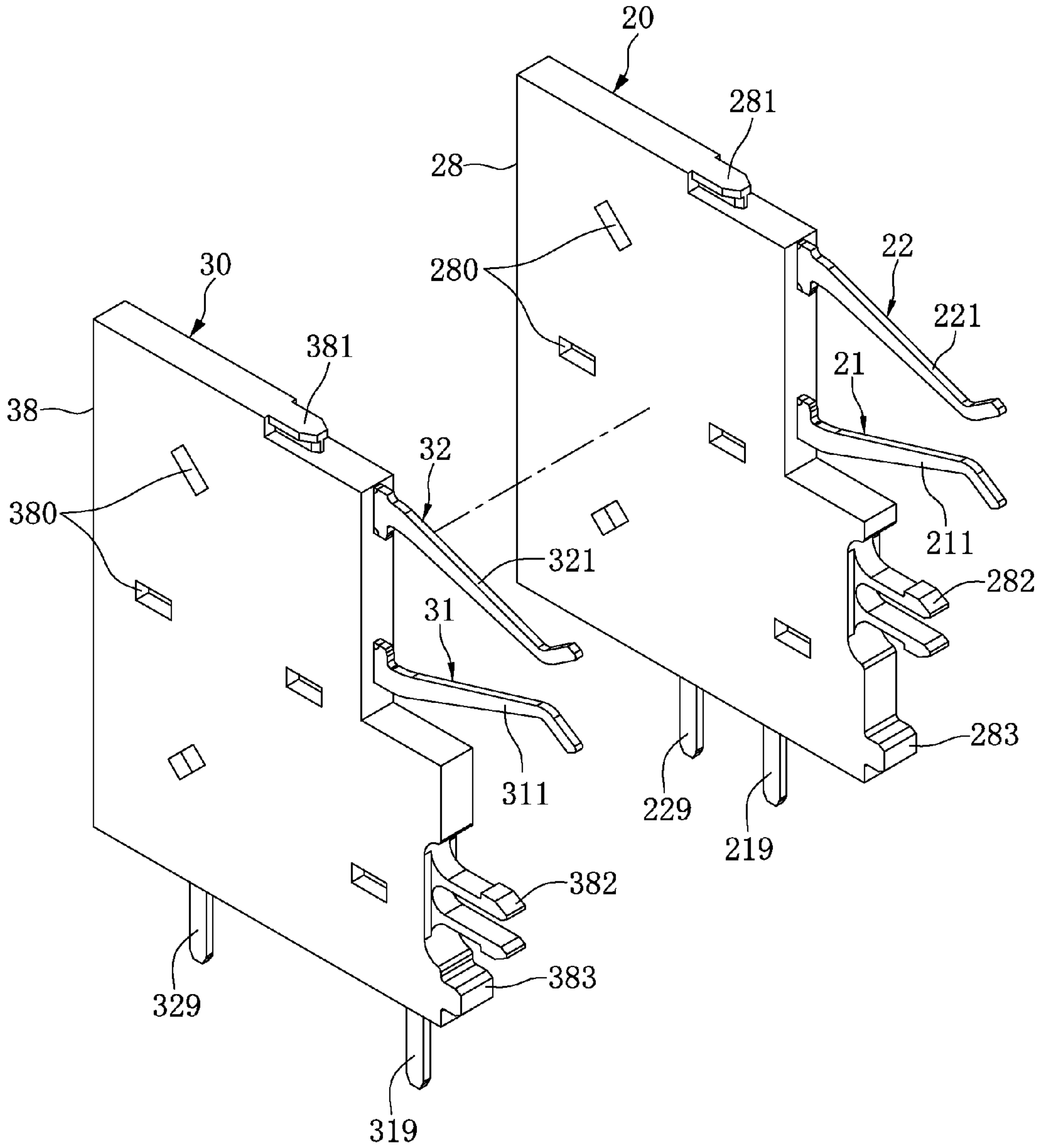
FIG. 4 is a perspective view of a terminal-wafer set in a separated condition according to the instant disclosure.
Figure 5:
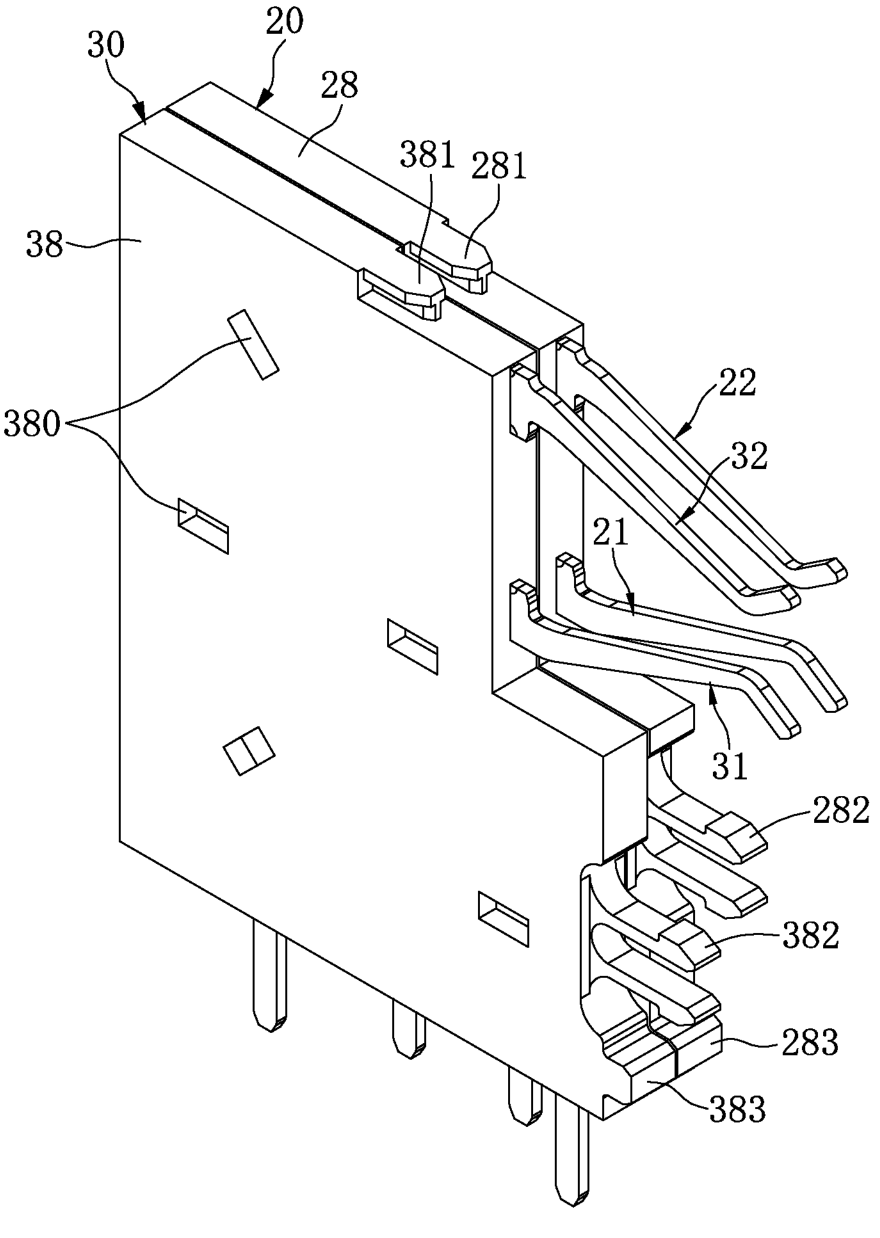
FIG. 5 is a perspective view of a terminal-wafer set in a contiguous condition according to the instant disclosure.

Refer to FIG. 3 to FIG. 5. FIG. 4 is a perspective view of a terminal-wafer set in divided condition of the present disclosure. FIG. 5 is a perspective view of the terminal-wafer set in contiguous condition. To facilitate guiding the terminal wafers 20, 30 properly assembled with the housing 10, this embodiment provides the housing 10 and the packaging bodies 28, 38 with many manners of orientation. First, the housing 10 is formed with a plurality of guiding channels 11 close to a top surface thereof. The terminal wafers 20, 30 respectively have an assembling wedge 281, 381 engaged with the guiding channels 11 correspondingly. The guiding channels 11 are arranged above the terminal slots 101, 102 correspondingly. The assembling wedges 281, 381 of this embodiment are T-shaped along the plugging direction (i.e. Z-axis direction). Refer to FIG. 1A, which is an enlarged view of the A portion of FIG. 1. Each guiding channel 11 is defined by two spaced-apart reversed T-shaped ridges 112. Therefore, it can prevent the terminal wafers 20, 30 from deviation in regard to the housing 10 along the traverse direction (i.e. X-axis direction). Because the positions of the guiding channels 11 are corresponding to the positions of the terminal slots 101, 102, the above-mentioned structure further has guiding and orientation functions.

Figure 9:
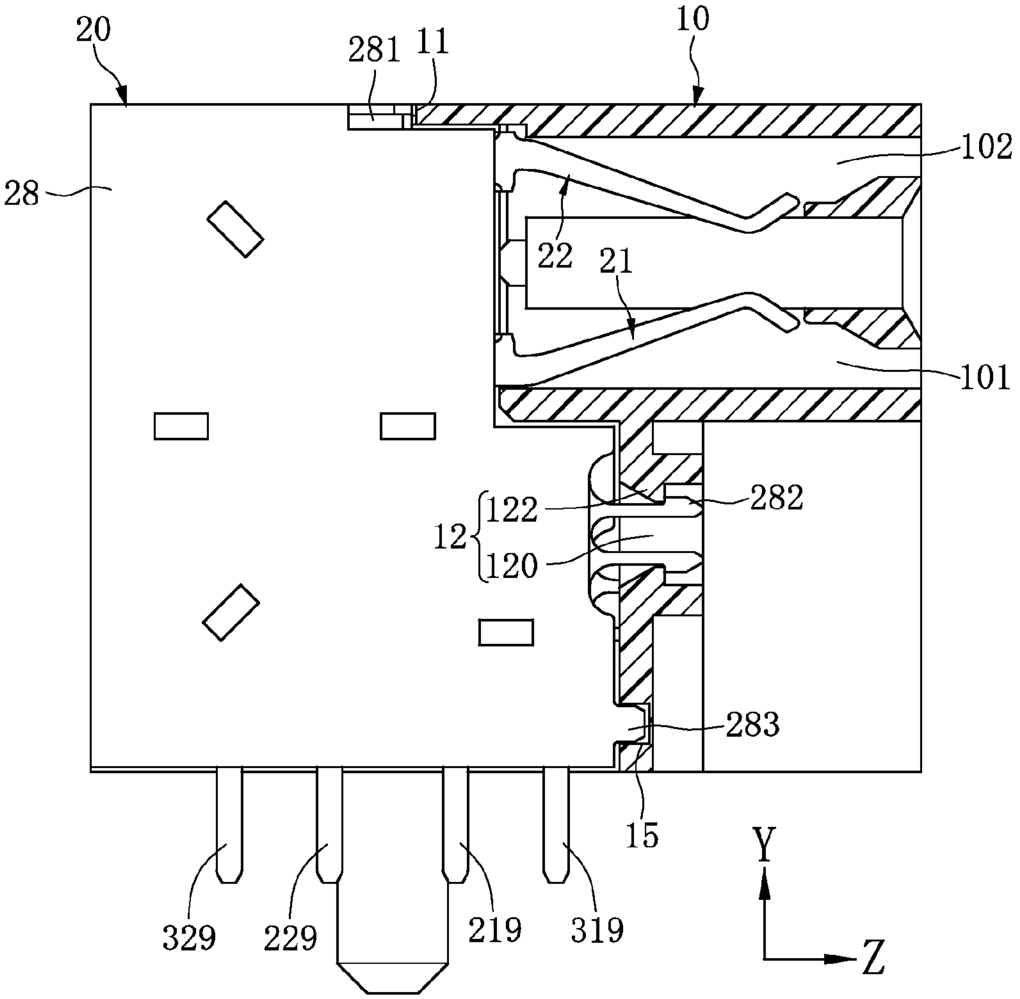
FIG. 9 is a cross-sectional view of a terminal-wafer set assembled in the housing according to the instant disclosure.

Moreover, the housing 10 is formed with hook-mating portions 12, 13. The terminal wafers 20, 30 respectively have a fastening hook 282, 382 correspondingly wedged with the hook-mating portions 12, 13. It therefore can limit a displacement of the terminal wafers 20, 30 in the plugging direction (i.e. Z-axis direction), so as to prevent the terminal wafers 20, 30 from escaping from the housing 10. The hook-mating portions 12, 13 respectively have inlet portions 120, 130 (as shown in FIG. 3), and an inner hook 122 (as shown in FIG. 9).

A supplementary note is that, in this embodiment, every two neighbor hook-mating portions 12, 13 are formed on the housing 10 in an up-and-down staggered manner, so that the hook-mating portions 12, 13 are arranged in two rows along the traverse direction (i.e. X-axis direction) (as shown in FIG. 3). The fastening hooks 282, 382 of the two neighbor terminal wafers 20, 30 are protruded from the packaging body 28 toward the housing 10 in an up-and-down staggered manner (as shown in FIG. 5, demonstrated with one terminal-wafer set). Such arrangement provides the every two neighbor hook-mating portions 12 (or 13) in one row with a thicker wall, so as to enhance the inner structure of the housing 10.

Further, the housing 10 has a positioning groove 15 formed in the traverse direction (i.e. X-axis direction). As shown in FIG. 4 and FIG. 5, the terminal wafers 20, 30 have a positioning rib 283, 383, respectively, which are contiguous to each other and inserted in the positioning grooves 15. Therefore, it can limit a displacement of the terminal wafers 20, 30 in regard to the housing 10 in a vertical direction (i.e. Y-axis direction).

Figure 6:
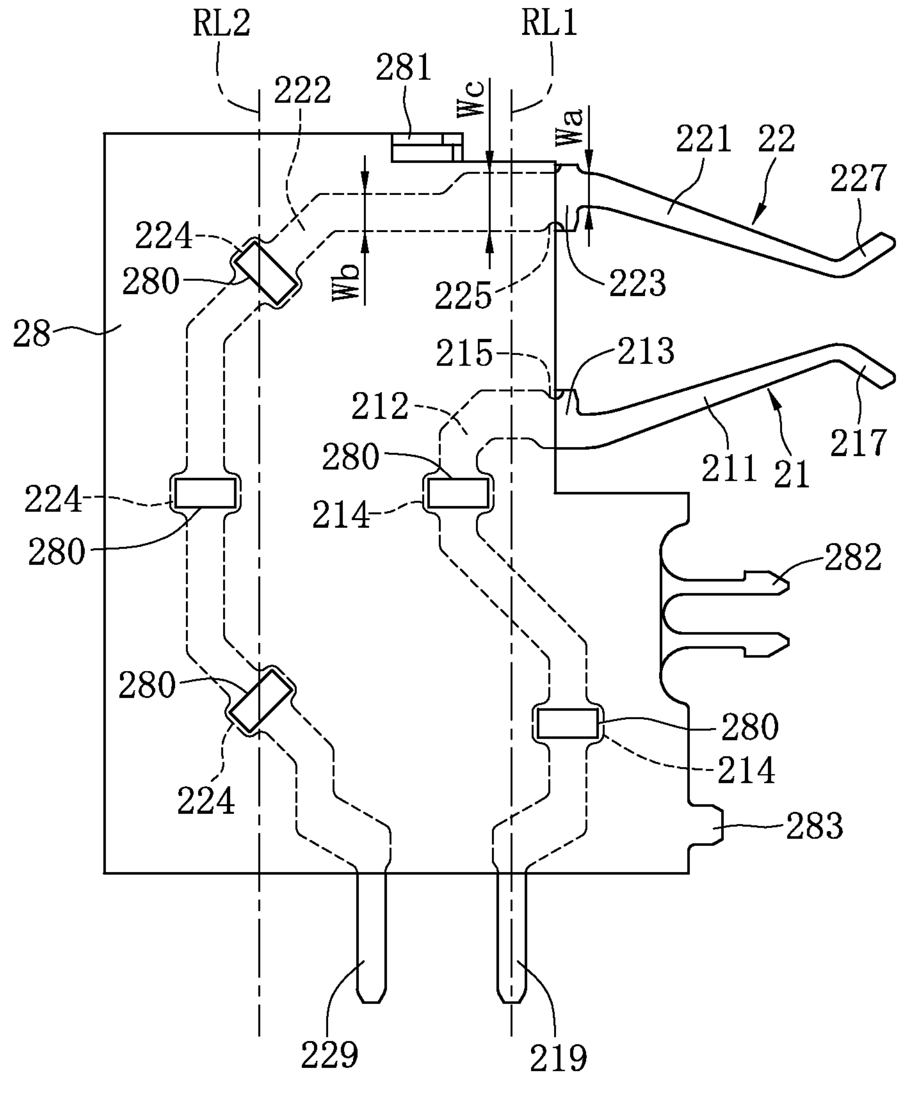
FIG. 6 is a side view of one kind of terminal wafer according to the instant disclosure.
Figure 7:
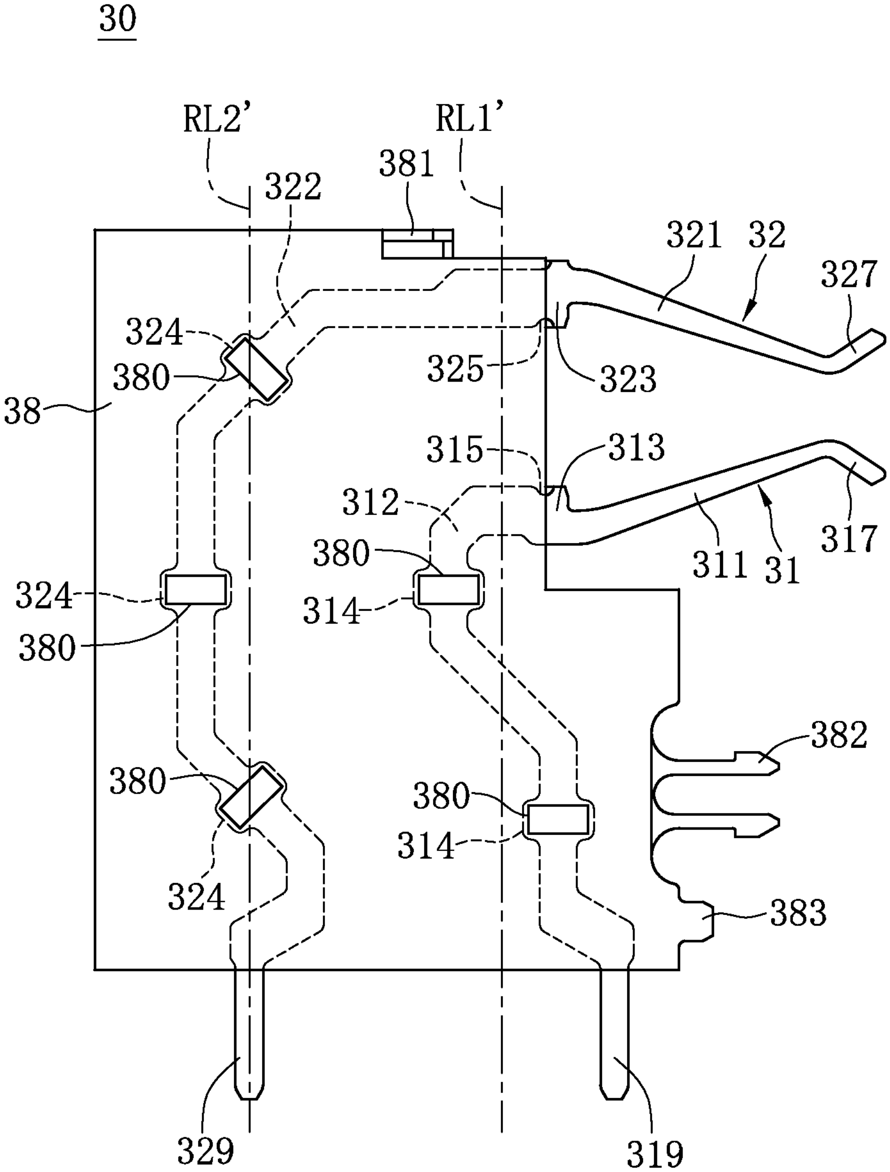
FIG. 7 is a side view of the other kind of terminal wafer according to the instant disclosure.

Refer to FIG. 6 and FIG. 7. The following is a detailed description of a terminal-wafer set of the present disclosure. Each packaging body 28 (38) of the terminal wafer 20 (30) is formed with a plurality of uncovering holes 280 (380) resulted from positioning the first terminal 21 (31) and the second terminal 22 (32) during the insert molding process. In other words, the first terminal 21 (31) and the second terminal 22 (32) are positioned by clamping tools in a mold. The first terminals 21 (31) and the second terminal 22 (32) have some portions corresponding to the uncovering holes 280 (380), which have a width being widened partially.

The first terminal 21 (31) has a first contacting section 211 (311), a first soldering portion 219 (319), and a first embedded section 212 (312) connecting the first contacting section 211 (311) and the first soldering portion 219 (319). The second terminal 22 (32) has a second contacting section 221 (321), a second soldering portion 229 (329), and a second embedded section 222 (322) connecting the second contacting section 221 (321) and the second soldering portion 229 (329). The first contacting section 211 (311) of the first terminal 21 (31) and the second contacting section 221 (321) of the second terminal 22 (32) are extended to one corresponding terminal slot 101 (102) in a pair along the plugging direction (as shown in FIG. 3).

The first contacting portion 211 (311) of each first terminal 21 (31) is extended from the first buffering section 213 (313) away from the packaging body 28 (38) slantingly, and has a width decreased gradually. Then, the first contacting portion 211 (311) is extended outwardly to form a first outer portion 217 (317). The second contacting portion 221 (321) of each second terminal 22 (32) is extended from the second buffering section 223 (323) away from the packaging body 28 (38) slantingly, and has a width decreased gradually. Then, the second contacting portion 221 (321) is extended outwardly to form a second outer portion 227 (327). The first contacting portion 211 (311) and the second contacting portion 221 (321) are closed towards each other along a direction away from the packaging body 28 (38).

Refer to FIG. 6. With regard to the first terminal wafer 20, each first terminal 21 has a first buffering section 213 close to the packaging body 28, and is connected between the first contacting section 211 and the first embedded section 212. Likewise, each second terminal 22 has a second buffering section 223 close to the packaging body 28, and is connected between the second contacting section 221 and the second embedded section 222.

Each first terminal 21 has a first indenting portion 215 arranged between the first buffering section 213 and the first embedded section 212. Each second terminal 22 has a second indenting portion 225 arranged between the second buffering section 223 and the second embedded section 222. The first indenting portion 215 and the second indenting portion 225 are concaved facing each other, which benefit impact-absorbing of the first contacting section 211 and the second contacting section 221 when being stretched outwardly along the vertical direction. The first embedded section 212 of each first terminal 21 has a biggest width adjacent to the first indenting portion 215. The second embedded section 222 of each second terminal 22 has a biggest width adjacent to the second indenting portion 225.

Refer to FIG. 7. With regard to the second terminal wafer 30, its structure is similar to the first terminal wafer 20. Each first terminal 31 has a first buffering section 313 close to the packaging body 38. The first buffering section 313 is connected between the first contacting section 311 and the first embedded section 312. Each second terminal 32 has a second buffering section 323 close to the packaging body 38. The second buffering section 323 is connected between the second contacting section 321 and the second embedded section 322. Each first terminal 31 has a first indenting portion 315 arranged between the first buffering section 313 and the first embedded section 312. Each second terminal 32 has a second indenting portion 325 arranged between the second buffering section 323 and the second embedded section 322.

The first embedded section 212 (312) of each first terminal 21 (31) has a width larger than a width of the first contacting section 211 (311), and larger than a width of the first soldering portion 219 (319). The second embedded section 222 (322) of each second terminal 22 (32) has a width larger than a width of the second contacting section 221 (321), and larger than a width of the second soldering portion 229 (329). From another view, the portions of the first terminal 21 (31) and the second terminal 22 (32) embedded in the packaging body 28 (38) have a width larger than that exposed outside, which benefit the electromagnetic coupling effect between the terminals. Therefore, this can enhance the reflux effect of high speed signals, and increase the transmission effect of high-speed signals. The first embedded section 212 (312) and the second embedded section 222 (322) have portions with enlarged width, which are wrapped by the packaging body 28 (38) and the structural strength is considered as follows. Take the second embedded section 222 in FIG. 6 for example. A minimum width Wb of the second embedded section 222 can be larger than a largest width Wa of the second contacting section 221. One half of a largest width We of the second embedded section 222 could be larger than a largest width Wa of the second contacting section 221 (that is 0.5*Wc>Wa). Since the largest width of the second embedded section 222 is arranged adjacent to where the second terminal 22 entered in the packaging body 28, it can strengthen the structure of the second terminal 22 to resist the moment produced by the electrical connector of this embodiment inserting into a mating electrical connector. The structure of the first embedded section 212 and the two terminals in FIG. 7 have a similar proportional relationship, and so are not described.

Each packaging body 28 (38) of the terminal wafer 20 (30) is formed with a plurality of uncovering holes 280 (380) resulted from positioning the first terminal 21 (31) and the second terminal 22 (32) during the insert molding process. The first embedded section 212 (312) and the second embedded section 222 (322) have a plurality of clamping portions 214, 224 (314, 324) with partial-enlarged width which are corresponding to the uncovering holes 280, 380.

As shown in FIG. 6 and FIG. 7, the packaging body 28 (38) wraps the first embedded section 212 (312) of the first terminal 21 (31) and the second embedded section 222 (322) of the second terminal 22 (32). With regard to the each of the packaging bodies 28 (or 38), the first embedded section 212 (or 312) and the second embedded section 222 (or 322) have homologous curving contours corresponding to each other, so that they appear with a dependency relationship of substantial equal distance. For the said "homologous curving contours corresponding to each other" with regard to the terminal wafer 20, the second embedded section 222 is a proportional enlargement of the first embedded section 212 substantially. With regard to the terminal wafer 30, the second embedded section 322 is a proportional enlargement of the first embedded section 312 substantially. The curving specifics will be described later. Such arrangements benefit to lower the electromagnet interference between the first terminal 21 (31) and the second terminal 22 (32) in the each of the terminal wafers 20 (or 30), and raise the performance of transmitting signals.

With regard to one terminal-wafer set, including two contiguous terminal wafers 20 and 30, the first embedded sections 212, 312 as shown in FIGS. 6 and 7, which are the portions of the first terminals 21 and 31 respectively wrapped in the packaging bodies 28 and 38, have identical contours with corresponding widths. Further, the first soldering portions 219 and 319, which are the other ends of the first terminals 21 and 31 exposed out of the packaging bodies 28 and 38, are parallel to each other along the plugging direction of the packaging body 28, 38 and staggered in front and back. Similarly, the second embedded sections 222 and 322, which are the portions of the second terminals 22, 32 respectively located in the packaging body 28, 38 of the terminal wafers 20 and 30, have identical contours with corresponding widths. The second soldering portions 229 and 329, which are the other ends of the second terminals 22, 32 and exposed outside of the packaging bodies 28 and 38, are parallel to each other along the plugging direction of the packaging body 28, 38 and staggered in front and back.

Figure 8:
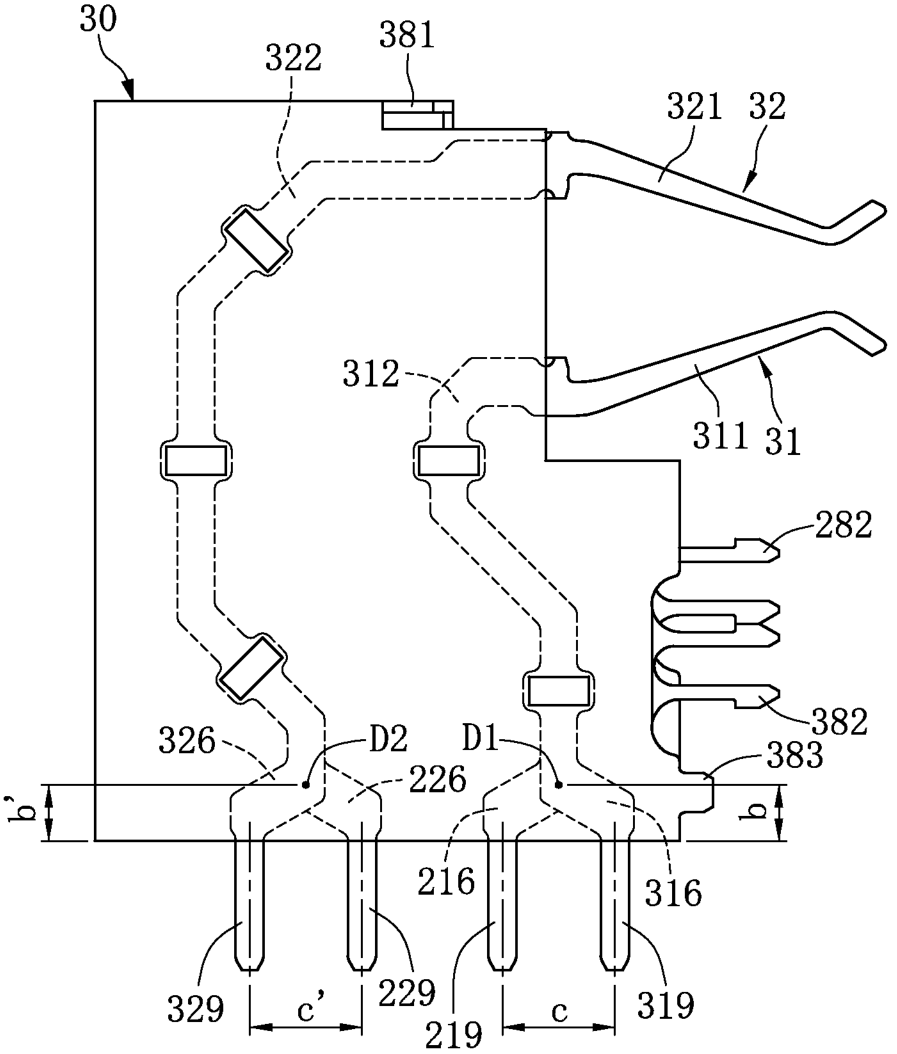
FIG. 8 is a side view of a terminal-wafer set in a contiguous condition according to the instant disclosure.

Refer to FIG. 6, FIG. 7 and FIG. 8. FIG. 8 is a side view of one terminal-wafer set which is composed of the terminal wafers 20 and 30 and arranged in a contiguous condition. This embodiment arranges the first terminals 21 and 31 in two contiguous terminal wafers 20 and 30 as one differential pair. The first terminals 21, 31 respectively have a first slanting portion 216, 316 with different slanging angles, which are extended from the first embedded section 212, 312 to the first soldering portion 219, 319. Thus, as shown in FIG. 8, the first slanting portions 216 and 316 of the two contiguous first terminals 21 and 31 have projected images in Y shape along the traverse direction, and define a forking point D1. The second terminals 22 and 32 in two contiguous terminal wafers 20 and 30 are arranged as one differential pair. The second terminals 22 and 32 respectively have a second slanting portion 226, 326 with different slanting angles, which are extended from the second embedded section 222, 322 to the second soldering portion 229, 329. Thus, as shown in FIG. 8, the second slanting portions 226 and 326 of the two contiguous second terminals 22 and 32 have projected images in Y shape along the traverse direction, and define another forking point D2. The above exemplified arrangements comply with the specification of PCIe, so that the first soldering portions 219, 319 and the second soldering portions 229, 329 of two contiguous terminal wafers 20, 30 are staggered.

Refer to FIG. 8. In regard to the first terminals 21, 31 of two contiguous terminal wafers 20, 30, a distance from the forking point D1 to a nearest outer edge (that is the bottom edge) of the packaging body 28, 38 along an extending direction of the first soldering portion 219, 319 is defined as a height component "b". A projection distance between the first soldering portions 219 and 319 of two contiguous terminal wafers 20 and 30 along the traverse direction is defined as a width component "c". In this embodiment, the ratio of the height component "b" and the width component "c" is smaller than 1. The smaller the height component "b" is, the better the signal transmission of the high frequency is. Such arrangement of this embodiment has the advantage that benefits the enhancement of return effect of a high speed signal, so as to raise the performance of high speed transmission.

Likewise, in regard to the second terminals 22 and 32 of two contiguous terminal wafers 20 and 30, a distance from the forking point D2 to a nearest edge (that is the bottom edge) of the packaging body 28, 38 along an extending direction of the second soldering portion 229, 329 is defined as a height component b'. A projection distance between the second soldering portions 229, 329 of two contiguous terminal wafers 20 and 30 along the traverse direction is defined as a width component c'. The ratio of the height component b' to the width component c' is smaller than 1.

Concerning to the two embedded sections in the same terminal wafer having a homologous curve shape corresponding to each other, it is described as followed. Refer to FIG. 6. For example, according to the terminal wafer 20, the first embedded section 212 of the first terminal 21 and the second embedded section 222 of the second terminal 22 have homologous curve shapes corresponding to each other. To describe in detail, a first reference line RL1 is defined along an extending direction of the first soldering portion 219 of the first terminal 21. The first embedded section 212 is extended from the first contacting section 211 toward an inner part of the packaging body 28, and extended from one side of the first reference line RL1 (right side of FIG. 6, or called as the first side) to the other side of the first reference line RL1 (left side of FIG. 6, or called as the second side), substantially in horizontal. Then, the first embedded section 212 is curved downward in a direction parallel to the first reference line RL1 and extended. Each curve angle of the above curved portions is larger than 90 degrees. In this embodiment, it is substantially trapezoid-shaped, and such curve angle benefits the electromagnetic coupling effect of high frequency signals. Continuously, the first embedded section 212 is extended from the other side of the first reference line RL1 (left side of FIG. 6, that is the second side) in a curved manner of substantial trapezoid-shape, to the first side of the first reference line RL1 (right side of FIG. 6). Finally, the first embedded section 212 is extended obliquely and curvedly to connect the first soldering portion 219.

Refer to FIG. 7. To take the terminal wafer 30 for example, a second reference line RL2' is defined along an extending direction of the second soldering portion 329 of the second terminal 32. The second embedded section 322 is extended from the second contacting section 321 toward an inner part of the packaging body 38, and extended from one side of the second reference line RL2' (right side of FIG. 7, or called as the first side) to the other side of the second reference line RL2' (left side of FIG. 7, or called the second side). This portion is substantially extended in a horizontal manner, and then passes through the second reference line RL2' obliquely. Following, the second embedded section 322 is curved downward along a direction parallel to the second reference line RL2'. Then, the second embedded section 322 is extended curvedly from the other side of the second reference line RL2' (left side of FIG. 7, the second side) to the first side of the second reference line RL2' (right side of FIG. 7). Each curve angle of the above curve portions is larger than 90 degrees, and is substantially trapezoid-shaped, which benefits the transmission of a high frequency signal. Finally, it is extended obliquely and curvedly to connect the second soldering portion 329. Similarly, the second embedded section 322 of the second terminal 32 in the packaging body 38 has curved angles larger than 90 degrees.

A supplementary note is that, for the terminal wafer 20 as shown in FIG. 6, a second reference line RL2 is further defined by the second terminal 22 which passes through at least two clamping portions 224. From another viewpoint, the second reference line RL2 in FIG. 6 and the second reference line RL2' in FIG. 7 have projections along the traverse direction (the direction of X-axis) which overlap. As shown in FIG. 6, the second terminal 22 is also extended from one side of the second reference line RL2 (right side of FIG. 6, or called as the first side) to the other side of the second reference line RL2 (left side of FIG. 6, or called as the second side), then extended curvedly to the first side of the second reference line RL2 (right side of FIG. 6).

In regard to the terminal wafer 30, as shown in FIG. 7, a first reference line RL1' is further defined by the first terminal 31 which substantially locates two clamping portions 314. From another viewpoint, the first reference line RL1' of FIG. 7 and the first reference line RL1 of FIG. 6 have projections along the traverse direction (the direction of X-axis) which overlap. As shown FIG. 7, the first terminal 31 is also extended from one side of the first reference line RL1 (right side of FIG. 7, or called as the first side) to the other side of the first reference line RL1 (left side of FIG. 7, or called as the second side), and then extended to the first side of the first reference line RL1 (right side of FIG. 7).

Concerning the configuration of the clamping portion, in regard to the terminal wafer 20, as shown in FIG. 6, the first terminal 21 and the second terminal 22 respectively have a clamping portion 214, 224 located at a middle position of the packaging body 28 in a vertical direction. The first terminal 21 has two clamping portions 214, and one of the clamping portions 214 is located between the clamping portion 214 at the middle position and the first soldering portion 219.

In regard to the terminal wafer 30, as shown in FIG. 7, the first terminal 31 and the second terminal 32 have a clamping portion 314, 324 respectively located at a middle position of the packaging body 38 in a vertical direction. The second terminal 32 has two clamping portions 324 which are located on a fictitious line extended from the second soldering portion 329 (that is the same as the second reference line RL2').

The present disclosure has features and functions as follows. The first terminal 21 (31) and the second terminal 22 (32) are first wrapped in the same one packaging body 28 (38) by insert molding technology, and then have assembly by the way of a terminal-wafer set. Thus, the assembly has a steady structure of high reliability, and transmission performance of high effectiveness. The shapes of the first terminal 21 (31) and the second terminal 22 (32) can be designed to have different widths in and out of the packaging body 28 (38), so that it benefits the electromagnetic coupling effect between the pair of first terminal pairs 21, 31 and the pair of second terminals 22, 32 in two contiguous terminal wafers 20, 30. Therefore, it can enhance the reflux effect of high speed signals, and increase the transmission effect of high-speed signals. In the same one terminal wafer, the first terminal and the second terminal have homologous curve shapes corresponding to each other, so that it benefits lowering the electromagnet interference between the first terminal and the second terminal, and raises the performance of transmitting signals.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. An electrical connector having terminals embedded in a packaging body, comprising:

a housing; and a plurality of terminal wafers contiguous to each other and fixed in the housing in a plugging direction; each terminal wafer having a first terminal, a second terminal, and a packaging body;

wherein the first terminal has a first contacting section, a first soldering portion, and a first embedded section connected the first contacting section to the first soldering portion;

wherein the second terminal has a second contacting section, a second soldering portion, and a second embedded section connected the second contacting section to the second soldering portion;

wherein the first contacting sections of the first terminals and the second contacting sections of the second terminals are extended along the plugging direction in pairs;

wherein the packaging body wraps the first embedded section of the first terminal and the second embedded section of the second terminal;

wherein each two contiguous first terminals of the terminal wafers are configured as a differential pair, and have a first slanting portion connecting the first embedded section to the first soldering portion with a slanting angle different to each other, respectively; so that projections of the two contiguous first slanting portions of the first terminals along a traverse direction are forked into a Y-shape and define a forking point, wherein the traverse direction is perpendicular to the plugging direction.

2. The electrical connector having terminals embedded in a packaging body as claimed in claim 1, wherein each two contiguous second terminals of the terminal wafers are configured as a differential pair, and have a second slanting portion connecting the second embedded section to the second soldering portion with a slanting angle different to each other, respectively; so that projections of the two contiguous second slanting portions of the second terminals are forked into a Y-shape along the traverse direction.

3. The electrical connector having terminals embedded in a packaging body as claimed in claim 1, wherein a shortest distance between the forking point and an outer edge of the packaging body along an extending direction of the first soldering portion is defined as a height component; wherein a projection of each of two contiguous first soldering portions of the terminal wafers along the traverse direction defines a width component therebetween; wherein a ratio of the height component to the width component is smaller than 1.

4. The electrical connector having terminals embedded in a packaging body as claimed in claim 1, wherein each of the first embedded sections of the first terminals has a width larger than a width of the first contacting section, and larger than a width of the first soldering portion; wherein each of the second embedded sections of the second terminals has a width larger than a width of the second contacting section, and larger than a width of the second soldering portion.

5. The electrical connector having terminals embedded in a packaging body as claimed in claim 4, wherein the packaging body of the terminal wafer is formed with a plurality of uncovering holes for an injection molding mold to position the first terminal and the second terminal, wherein the first embedded section and the second embedded section have a plurality of clamping portions with partial enlarged width corresponding to the uncovering holes.

6. The electrical connector having terminals embedded in a packaging body as claimed in claim 1, wherein the first terminal is defined with a first reference line along an extending direction of the first soldering portion;

wherein the first embedded section is extended from the first contacting section toward an inner part of the packaging body from a first side of the first reference line to a second side of the first reference line, and bending downward substantially parallel to the first reference line, then extended curvedly from the second side of the first reference line to the first side of the first reference line, finally extended curvedly and connected with the first soldering portion.

7. The electrical connector having terminals embedded in a packaging body as claimed in claim 6, wherein the first embedded section of the first terminal has a curved angle in the packaging body being larger than 90 degrees.

8. The electrical connector having terminals embedded in a packaging body as claimed in claim 6, wherein the second terminal is defined with a second reference line in an extending direction of the second soldering portion;

wherein the second embedded section is extended from the second contacting section toward an inner part of the packaging body from a first side of the second reference line to a second side of the second reference line, then bending downward substantially parallel to the second reference line, and extended curvedly from the second side of the second reference line to the first side of the second reference line, then extended curvedly and connected with the second soldering portion.

9. The electrical connector having terminals embedded in a packaging body as claimed in claim 8, wherein the second embedded section of the second terminal has a curved angle in the packaging body being larger than 90 degrees.

10. The electrical connector having terminals embedded in a packaging body as claimed in claim 1, wherein the housing has a plurality of terminal slots formed along a traverse direction thereof; wherein the first contacting section of the first terminal and the second contacting section of the second terminal are extended in pair to one of the terminal slots correspondingly.

11. The electrical connector having terminals embedded in a packaging body as claimed in claim 10, wherein the housing is formed with a plurality of guiding channels, the terminal wafers respectively have an assembling wedge engaged with the guiding channels correspondingly, the guiding channels are arranged above the terminal slots correspondingly.

12. The electrical connector having terminals embedded in a packaging body as claimed in claim 11, wherein the housing is formed with hook-mating portions, the terminal wafers respectively have a fastening hook correspondingly wedged with the hook-mating portions.

13. The electrical connector having terminals embedded in a packaging body as claimed in claim 12, wherein every neighbor two of the hook-mating portions are formed on the housing in an up-and-down staggered manner, whereby the hook-mating portions are arranged in two rows along the traverse direction, wherein the fastening hooks of the two neighbor terminal wafers are protruded from the packaging body toward the housing in an up-and-down staggered manner.

14. The electrical connector having terminals embedded in a packaging body as claimed in claim 13, wherein the housing has a positioning groove formed in the traverse direction, wherein the terminal wafers have a positioning rib respectively, the positioning ribs are contiguous to each other and inserted in the positioning grooves.

15. The electrical connector having terminals embedded in a packaging body as claimed in claim 1, wherein each of the first terminals has a first buffering section closed to the packaging body, and is connected between the first contacting section and the first embedded section, wherein each of the second terminal has a second buffering section closed to the packaging body, and is connected between the second contacting section and the second embedded section.

16. The electrical connector having terminals embedded in a packaging body as claimed in claim 15, wherein each of the first terminals has a first indenting portion arranged between the first buffering section and the first embedded section, wherein each of the second terminals has a second indenting portion arranged between the second buffering section and the second embedded section, wherein the first indenting portion and the second indenting portion are concaved facing each other.

17. The electrical connector having terminals embedded in a packaging body as claimed in claim 16, wherein the first embedded section of the first terminal has a biggest width adjacent to the first indenting portion, wherein the second embedded section of the second terminal has a biggest width adjacent to the second indenting portion.

18. The electrical connector having terminals embedded in a packaging body as claimed in claim 15, wherein the first contacting portion of the first terminal is extended from the first buffering section away from the packaging body slantingly, having a width decreased gradually, and the first contacting portion is extended outwardly to form a first outer portion;

wherein the second contacting portion of the second terminal is extended from the second buffering section away from the packaging body slantingly, having a width decreased gradually, and the second contacting portion is extended outwardly to form a second outer portion, whereby the first contacting portion and the second contacting portion are closed towards each other along a direction away from the packaging body.

19. The electrical connector having terminals embedded in a packaging body as claimed in claim 1, wherein each the packaging body of the terminal wafer is formed with a plurality of uncovering holes resulted from positioning the first terminal and the second terminal during the insert molding process, wherein the first embedded section and the second embedded section have a plurality of clamping portions with partial-enlarged width corresponding to the uncovering holes.

20. The electrical connector having terminals embedded in a packaging body as claimed in claim 19, wherein the first terminal and the second terminal respectively have one of the clamping portions located at a middle position of the packaging body in a vertical direction, wherein the first terminal has two of the clamping portions, and one of the clamping portions is located between the clamping portion at the middle position and the first soldering portion, wherein the second terminal has two of the clamping portions located on a fictitious line extended from the second soldering portion.

* * * * *